US008498576B2

(12) United States Patent
Madan et al.

(10) Patent No.: US 8,498,576 B2
(45) Date of Patent: Jul. 30, 2013

(54) INVERSE-MODE BIPOLAR TRANSISTOR RADIO-FREQUENCY SWITCHES AND METHODS OF USING SAME

(75) Inventors: Anuj Madan, Atlanta, GA (US); John D. Cressler, Smyrna, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 297 days.

(21) Appl. No.: 13/082,450

(22) Filed: Apr. 8, 2011

(65) Prior Publication Data

US 2011/0248771 A1    Oct. 13, 2011

Related U.S. Application Data

(60) Provisional application No. 61/322,053, filed on Apr. 8, 2010.

(51) Int. Cl.
*H04B 1/00* (2006.01)
*H04B 15/00* (2006.01)
*H04B 1/10* (2006.01)
*H04M 1/00* (2006.01)

(52) U.S. Cl.
USPC ................. 455/63.3; 455/550.1; 455/287

(58) Field of Classification Search
USPC .......... 455/500, 633, 66.1, 703, 550.1, 553.1, 455/552.1, 132, 146, 150.1, 168.1, 188.1, 455/266, 287; 375/351
See application file for complete search history.

(56) References Cited

U.S. PATENT DOCUMENTS

| | | | | |
|---|---|---|---|---|
| 4,466,128 A * | 8/1984 | Couvillon | ..................... | 455/208 |
| 5,969,561 A * | 10/1999 | McGillan | ..................... | 327/308 |
| 6,204,728 B1 * | 3/2001 | Hageraats | ..................... | 330/98 |
| 6,271,727 B1 * | 8/2001 | Schmukler | ..................... | 330/284 |
| 6,654,262 B2 * | 11/2003 | Hussein et al. | ................. | 363/49 |
| 8,279,019 B2 * | 10/2012 | Nicolson et al. | ............ | 333/81 A |
| 2007/0247211 A1 * | 10/2007 | Brindle | ..................... | 327/365 |
| 2010/0203846 A1 * | 8/2010 | Gorbachov | .................... | 455/83 |
| 2011/0025435 A1 * | 2/2011 | Gorbachov | .................... | 333/245 |
| 2012/0068771 A1 * | 3/2012 | Carroll et al. | ................ | 330/291 |
| 2012/0250397 A1 * | 10/2012 | Ohmaru | ..................... | 365/149 |

* cited by examiner

*Primary Examiner* — Andrew Wendell
(74) *Attorney, Agent, or Firm* — Ryan A. Schneider, Esq.; Troutman Sanders LLP

(57) ABSTRACT

The various embodiments of the present disclosure relate generally to inverse-mode Radio-Frequency ("RF") switching circuits and methods of using the same. An embodiment of the present invention provides an inverse-mode RF switching circuit. The inverse-mode RF switching circuit comprises a bipolar transistor, a shunt element, a first RF channel, and a second RF channel. The bipolar transistor comprises a base, a collector, and an emitter, wherein the base and emitter are in electrical communication first via a base-emitter junction and second via an electrical connection element. The shunt element is in electrical communication with the collector. The first RF channel is in electrical communication with the base and emitter. The second RF channel is in electrical communication with the collector and the shunt element. The base-collector junction operates as a switching diode between the first RF channel and the second RF channel.

18 Claims, 12 Drawing Sheets

INVERSE-MODE BIPOLAR TRANSISTOR RADIO-FREQUENCY SWITCHES AND METHODS OF USING SAME

CROSS-REFERENCE TO RELATED APPLICATIONS

This application claims the benefit of U.S. Provisional Application Ser. No. 61/322,053, filed 8 Apr. 2010, which is incorporated herein by reference in its entirety as if fully set forth below.

TECHNICAL FIELD OF THE INVENTION

The various embodiments of the present disclosure relate generally to radio-frequency switches. More particularly, the various embodiments of the present invention are directed to inverse-mode radio-frequency switches and methods of using the same.

BACKGROUND OF THE INVENTION

Highly-integrated, low-cost circuits have fueled the growth of BiCMOS technology for Radio-Frequency ("RF") applications. Aggressive technology scaling and the integration of bandgap-engineered Silicon-Germanium ("SiGe") technologies have resulted in dramatic performance improvements of silicon-based RF integrated circuits, thus providing cost advantages over III-V technologies. RF switches are crucial for operation of any radar or wireless transceiver. In addition to transmit/receive functionality, RF switches can be used for digital gain control and phase state selection in a typical RF frontend.

Several specifications can be used to measure the performance of an RF switch, including insertion loss, compression point, single event effect immunity, isolation, and linearity. Insertion loss refers to signal loss that occurs when an RF switch is placed between a transceiver and an antenna. Thus, a goal of RF switches is to minimize insertion loss. An RF switch's compression point refers to the maximum power handling capability of the switch. Thus, a goal of RF switches is to maximize the compression point. Single event effect immunity refers to a switch's immunity to resist strikes from heavy ions, which can cause transistors to be shorted together. Thus, a goal of RF switches is to maximize the single event effect immunity. Isolation refers to signal leakage from the transmitter to the receiver when the transmitter is transmitting a signal, and vice versa. Thus, a goal of RF switches is to maximize isolation, which minimizes signal leakage. Finally, linearity refers to a switch's ability to maintain the amplitude and phase information in a modulated signal and limit or prevent intermodulation distortion as the frequency of the signal is increased. Thus, a goal of RF switches is to maximize linearity.

Conventional RF switches operate by switching the base-emitter junction of a bipolar transistor. This type of switching is known as forward-mode switching. Unfortunately, conventional RF switches have been unable to realize the benefits of SiGe Heterojunction Bipolar Transistors ("HBTs"). Due to the higher non-linearity in conventional SiGe HBTs, conventional RF switches in systems with high linearity or dynamic range requirements have been forced to employ CMOS-based RF switches. While technology scaling and layout optimization has resulted in low insertion loss for CMOS-based RF switches, shorter channel length and a thinner oxide has limited the dynamic range and high power handling capability of the CMOS switches. Recently, near one watt X-band Power Amplifiers ("PA") in SiGe BiCMOS technology have been demonstrated. Further, SiGe HBT device performance has been constantly improving, such that $f_T$ is now routinely above 200 GHz—even approaching 500 GHz. Therefore, there is a need for high power handling silicon RF switches. Because solutions already are available for integrating the balun and high power PA on a single chip, a high power, low insertion loss, and high linearity T/R RF switch becomes the last external component (excluding the crystal oscillator) that needs to be integrated on a chip to provide the most cost-efficient system-level solution. The present invention is primarily directed to such an RF switch.

BRIEF SUMMARY OF THE INVENTION

The present invention relates to inverse-mode RF switches and methods of using the same. An exemplary embodiment of the present invention provides an inverse-mode RF switching circuit. The inverse-mode RF switching circuit comprises a bipolar transistor, a shunt element, a first RF channel, and a second RF channel. The bipolar transistor comprises a base, a collector, and an emitter, wherein the base and emitter are in electrical communication first via a base-emitter junction and second via an electrical connection element. The shunt element is in electrical communication with the collector. The first RF channel is in electrical communication with the base and emitter. The second RF channel is in electrical communication with the collector and the shunt element. The base-collector junction of the bipolar transistor operates as a switching diode between the first RF channel and the second RF channel.

In an exemplary embodiment of the inverse-mode RF switching circuit, the shunt element comprises a p-channel MOSFET. In another exemplary embodiment of the inverse-mode RF switching circuit, the shunt element comprises a second bipolar transistor. In yet another exemplary embodiment of the inverse-mode RF switching circuit, the shunt element comprises a PIN diode. In still yet another exemplary embodiment of the inverse-mode RF switching circuit, the shunt element comprises an n-channel MOSFET. In some embodiments of the present invention, the bipolar transistor is a SiGe HBT. In some embodiments of the present invention, the base and emitter are in direct electrical communication via an electrical connection element.

Another exemplary embodiment of the present invention provides an inverse-mode RF switching circuit comprising a bipolar transistor and a shunt element. The bipolar transistor comprises a base, a collector, an emitter, a base-emitter junction, and a base-collector junction, wherein the base and the emitter are in electrical communication first via the base-emitter junction and second via an electrical connection element. The shunt element is in electrical communication with the collector. A RF signal passes from the emitter to the collector, or from the collector to the emitter, when the base-collector junction is forward-biased.

Another exemplary embodiment of the present invention provides a method of switching an RF signal. The method comprises providing an inverse-mode RF switching circuit, receiving an RF signal from a first RF channel, transmitting the RF signal to a second RF channel when a base-collector junction is forward-biased, and preventing the transmission of the RF signal to the second RF channel when the base-collector junction is reverse-biased. The inverse-mode RF switching circuit comprises a bipolar transistor, a shunt element, the first RF channel, and the second RF channel.

Some exemplary embodiments of the present invention provide improvements to an RF switching circuit comprising a bipolar transistor, a first RF channel in electrical communication with the bipolar transistor, and a second RF channel in electrical communication with the bipolar transistor, the RF switching circuit achieving a first isolation performance in the frequency range of 2 GHz to 9.5 GHz, the RF switch achieving a first P1dB compression point at 9.5 GHz, the RF switching circuit achieving a first linearity performance in the X band frequency range. In an exemplary embodiment of the present invention, the improvement comprises wherein the RF switching circuit achieves a second isolation performance at least 5 dB greater than the first isolation performance in the frequency range 2 GHz to 9.5 GHz. In another exemplary embodiment of the present invention, the improvement comprises wherein the RF switching circuit achieves a second P1dB compression point that is at least 11 dB greater than the first P1dB compression point at a frequency of 9.5 GHz. In yet another exemplary embodiment of the present invention, the improvement comprises wherein the RF switching circuit achieves a second linearity performance at least 10 dB greater than the first linearity performance in the X band frequency range. In still yet another exemplary embodiment of the present invention, the improvement comprises wherein the RF switching circuit can withstand more than 30 dBm RF input power at a frequency of 9.5 GHz before insertion loss performance begins to degrade. In even still yet another exemplary embodiment of the present invention, the improvement comprises wherein the RF switching circuit can withstand more than 30 dBm RF input power at a frequency of 9.5 GHz before insertion loss performance begins to degrade.

These and other aspects of the present invention are described in the Detailed Description below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. While one or more embodiments may be discussed as having certain advantageous features, one or more of such features may also be used with the various embodiments of the invention discussed herein. In similar fashion, while exemplary embodiments may be discussed below as system or method embodiments, it is to be understood that such exemplary embodiments can be implemented in various devices, systems, and methods of the present invention.

BRIEF DESCRIPTION OF DRAWINGS

The following Detailed Description of preferred embodiments is better understood when read in conjunction with the appended drawings. For the purposes of illustration, there is shown in the drawings exemplary embodiments, but the subject matter is not limited to the specific elements and instrumentalities disclosed.

DETAILED DESCRIPTION OF THE INVENTION

Figure 1:
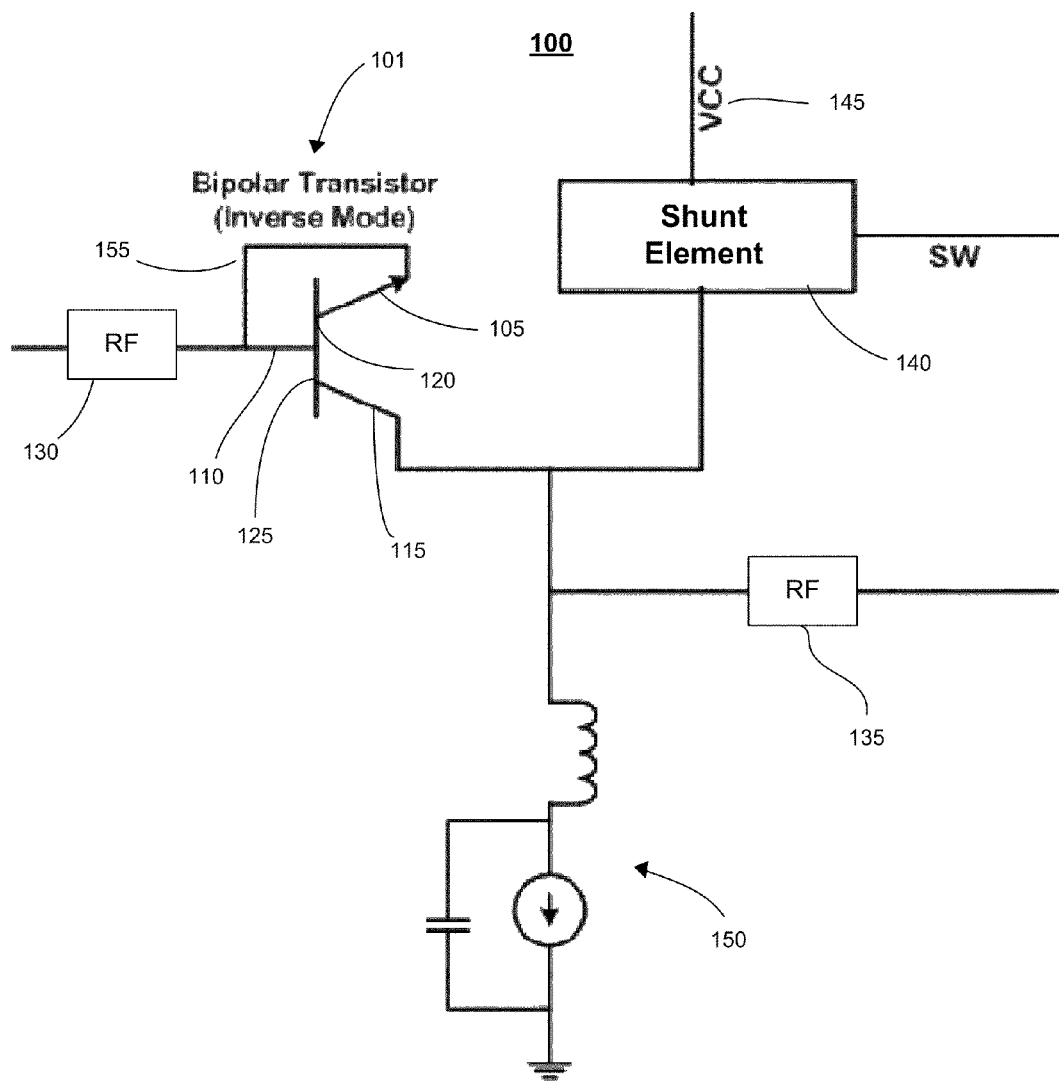
FIG. 1 provides a circuit model schematic of an exemplary inverse-mode radio-frequency switching circuit of the present invention.

To facilitate an understanding of the principles and features of the present invention, various illustrative embodiments are explained below. In particular, the invention is described in the context of being an inverse-mode bipolar transistor RF switch. Embodiments of the present invention may be applied to systems or methods for transmitting and receiving radio-frequency signals. Embodiments of the invention, however, are not limited to use in systems and methods for switching radio-frequency signals described herein. As those of ordinary skill in the art would understand, embodiments of the invention can be used by many systems or methods for switching RF signals, including, but not limited to, military radar, mobile phones, Wi-Fi, Wi-Max, and the like. As described herein, RF is not limited to any particular frequency band and includes, but is not limited to, the High Frequency ("HF") band, the Very High Frequency ("VHF") band, the Ultra High Frequency ("UHF") band, Long wave ("L") band, Short wave ("S") band, the C band, the X band, the Kurz-Under ("$K_u$") band, the Kurz ("K") band, the Kurz-Above ("$K_a$") band, the V band, the W band, the mm band, and the like.

The components described hereinafter as making up various elements of the invention are intended to be illustrative and not restrictive. Many suitable components or steps that would perform the same or similar functions as the components or steps described herein are intended to be embraced within the scope of the invention. Such other components or steps not described herein can include, but are not limited to, for example, similar components or steps that are developed after development of the invention.

Several features of the present invention are defined to be in electrical communication with other features of the present invention. As used herein, element A is in electrical communication with element B if element A and element B are coupled to each other in such a way that electrical current can pass along a communication path from element A to element B or from element B to element A. Further, electrical communication between two elements may be direct or indirect.

As used herein, element A is in direct electrical communication with element B if the communication path between element A and element B has an electrical resistance of substantially zero ohms. As used herein, element A is in indirect electrical communication with element B if the communication path between element A and element B has an electrical resistance with a magnitude greater than substantially zero ohms. Moreover, whenever any two features of the present invention are said to be in electrical communication with each other, the two features may by in electrical communication via an electrical connection element. As used herein and as those skilled in the art would recognize, an electrical connection element can be electrical connection elements known in the art or developed at a later time, including but not limited to, an electrical conductor, a combination of electrical components, e.g. resistors, capacitors, inductors, and the like, an electrical circuit, solder, and the like. Further, an electrical connection element can provide direct or indirect electrical communication between two elements.

An exemplary embodiment of the present invention provides an inverse-mode RF switching circuit 100. FIG. 1 provides an exemplary, non-limiting inverse mode RF switching circuit 100 of the present invention. The switching circuit 100 can comprise a bipolar transistor 101 comprising a base 110, a collector 115, and an emitter 105. The bipolar transistor 101 can be any bipolar transistor known in the art, including, but not limited to an NPN bipolar transistor, a PNP bipolar transistor, a HBT, and the like. In an exemplary embodiment, the bipolar transistor 101 is a SiGe HBT. The base 110 can be in electrical communication with the emitter 105. In some embodiments, the base 110 is in electrical communication with the emitter 105 first via a base-emitter junction 120 and second via an electrical connection element 155. This means that in addition to being in electrical communication via the base-emitter junction 120, the base 110 can be in electrical communication with the emitter 105 via an electrical connection element 155. In some embodiments of the present invention, the base 110 and emitter 105 are in direct electrical communication, i.e. there are no electrical components in the electrical communication path between the base 110 and the emitter 105. FIG. 1 provides an exemplary embodiment of an RF switching circuit 100 where the base 110 and emitter 105 are in direct electrical communication.

The RF switching circuit 100 can also comprise a shunt element 140 in electrical communication with the collector 115. In an exemplary embodiment, the shunt element 140 is in direct electrical communication with the collector 115. In another exemplary embodiment of the present invention, the shunt element 140 is in electrical communication with the collector 115 via an electrical connection element (not shown). The shunt element 140 can be a shunt element or shunt device known in the art or developed at a later time, including, but not limited to, a p-channel MOSFET, an n-channel MOSFET, a bipolar transistor, a PIN diode, and the like.

The RF switching circuit 100 can also comprise a first RF channel 130 in electrical communication with the base 110 and emitter 105. In an exemplary embodiment of the present invention, the first RF channel 130 is in direct electrical communication with the base 110 and emitter 105. In another exemplary embodiment, the first RF channel 130 is in electrical communication with the base 110 and/or emitter 105 via an electrical connection element. Additionally, the RF switching circuit 100 can comprise a second RF channel 135 in electrical communication with the collector 115 and shunt element 140. In an exemplary embodiment of the present invention, the second RF channel 135 is in direct electrical communication with the collector 115 and/or the shunt element 140. In another exemplary embodiment of the present invention, the second RF channel 135 is in electrical communication with the shunt element 140 and/or collector 115 via an electrical connection element (not shown). In some embodiments of the present invention, the first RF channel 130 and the second RF channel 135 can each carry an RF signal. Thus, in some embodiments of the present invention, the first RF channel and the second RF channel can carry an RF input signal or an RF output signal, with respect to the switch. In the RF switching circuit 100, a base-collector junction 125 of the bipolar transistor 101 operates as a switching diode between the first RF channel 130 and the second RF channel 135.

Figure 2:
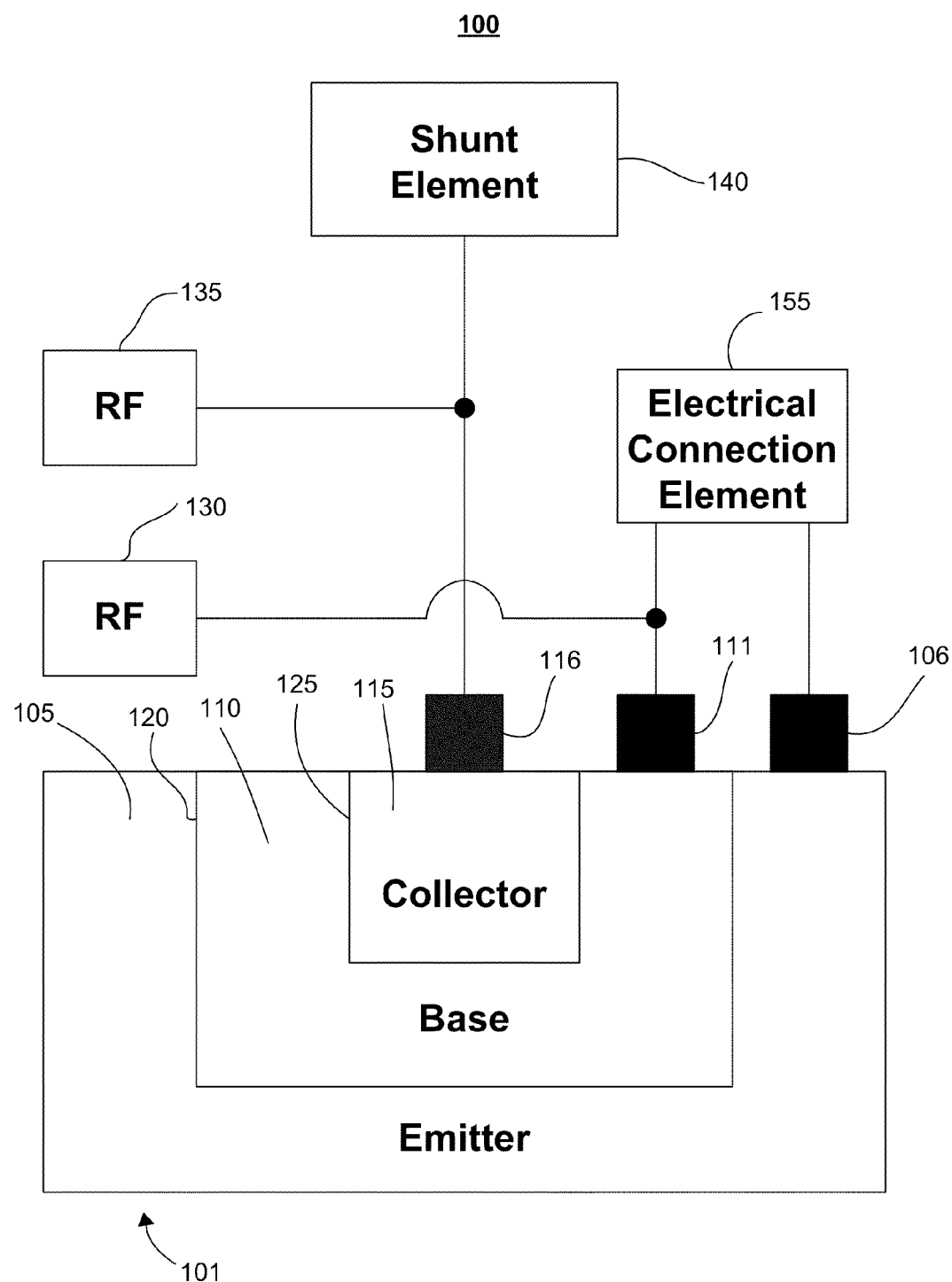
FIG. 2 provides a model layout of an exemplary inverse-mode radio-frequency switching circuit of the present invention.

FIG. 2 provides another exemplary embodiment of an RF switching circuit 100. The switching circuit 100 comprises a shunt element 140, a first RF channel 130, a second RF channel 135, and a bipolar transistor 101 comprising a collector 115 with a collector contact 116, a base 110 with a base contact 111, and an emitter 105 with an emitter contact 106. The collector contact 116 can provide electrical communication between the collector 116 and some other electrical component. The base contact 111 can provide electrical communication between the base 110 and some other electrical component. The emitter contact 106 can provide electrical communication between the emitter 105 and some other electrical component.

In some embodiments of the present invention, the base contact 111 can be in communication with the emitter contact 106 first via a base-emitter junction 120 and second via an electrical connection element 155; thus, the base 110 can be in electrical communication with the emitter 105 via the base contact 111, electrical connection element 155, and collector contact 116. The shunt element 140 can be in electrical communication with the collector contact 116; thus, the shunt element 140 can be in electrical communication with the collector 115 via the collector contact 116. In some embodiments of the present invention, the shunt element 140 can be in electrical communication with the collector contact 116 via an electrical connection element (not shown). The first RF channel 130 can be in electrical communication with the base contact 111 and emitter contact 106. The second RF channel 135 can be in electrical communication with the shunt element 140 and the collector contact 116.

In some embodiments of the present invention, the inverse-mode RF switching circuit 100 can comprise a grounding element 150 (shown in FIG. 1) in electrical communication with the collector 115 and configured to place the collector 115 in electrical communication with the ground. The grounding element 150 can be a grounding element known in the art or developed at a later time and can comprise a combination of electrical components or electrical connection elements.

As discussed above, in some embodiments of the present invention, the base-collector junction 125 operates as a switching diode between the first RF channel 130 and the second RF channel 135. Thus, in some embodiments of the invention, an RF signal passes from the emitter 105 to the collector 115 when the base-collector junction 125 of the bipolar transistor 101 is forward-biased, i.e. the switch is ON. Further, because the inverse-mode RF switching circuit 100 can be a bidirectional switch, in some embodiments of the present invention, an RF signal passes from the collector 115 to the emitter 105 when the base-collector junction 125 of the bipolar transistor 101 is forward-biased. In some embodiments of the present invention, an RF signal is prevented from passing from the collector 115 to the emitter 105 or from the emitter 105 to the collector 115 when the base-collector junction 125 is not forward-biased, or is reverse-biased, i.e. the switch is OFF.

The operation of an exemplary RF switching circuit 100 will now be described. The bipolar transistor 101 can act as the series switching element between the first RF channel 130 and the second RF channel 135 while the shunt element 140 can be used to pull-up the switching circuit in the OFF state. When the switch is ON, the base-collector switching junction 125 is forward-biased and current flows from the emitter 105 into the collector 115. When the switch is OFF, the shunt element 140 pulls the collector voltage of the bipolar transistor to the $V_{CC}$ rail 145 and substantially eliminates DC current flow through the switch.

In an exemplary embodiment of the present invention, a Single-Pole, Single-Throw ("SPST") RF switching circuit can be designed using SiGe HBT's from a commercially available 0.35 μm SiGe BiCMOS technology. In some embodiments, Thru-Silicon Via ("TSV") technology can be used to provide a low ground plane inductance, which can be highly desirable for power-amplifier applications.

In some embodiments of the present invention, the dimensions of the SiGe HBT can be chosen to be 0.8×20 μm$^2$ with three emitter stripes with a peak $f_T$ of 33 GHz. The three-stripe device can have an a-c-b-e-b-e-b-e-b-c three-stripe layout. These dimensions and specifications are not intended to limit the scope of the invention. Instead, as those skilled in the art would understand, the SiGe HBT of the present invention can have many different dimensions and specifications.

Figure 3:
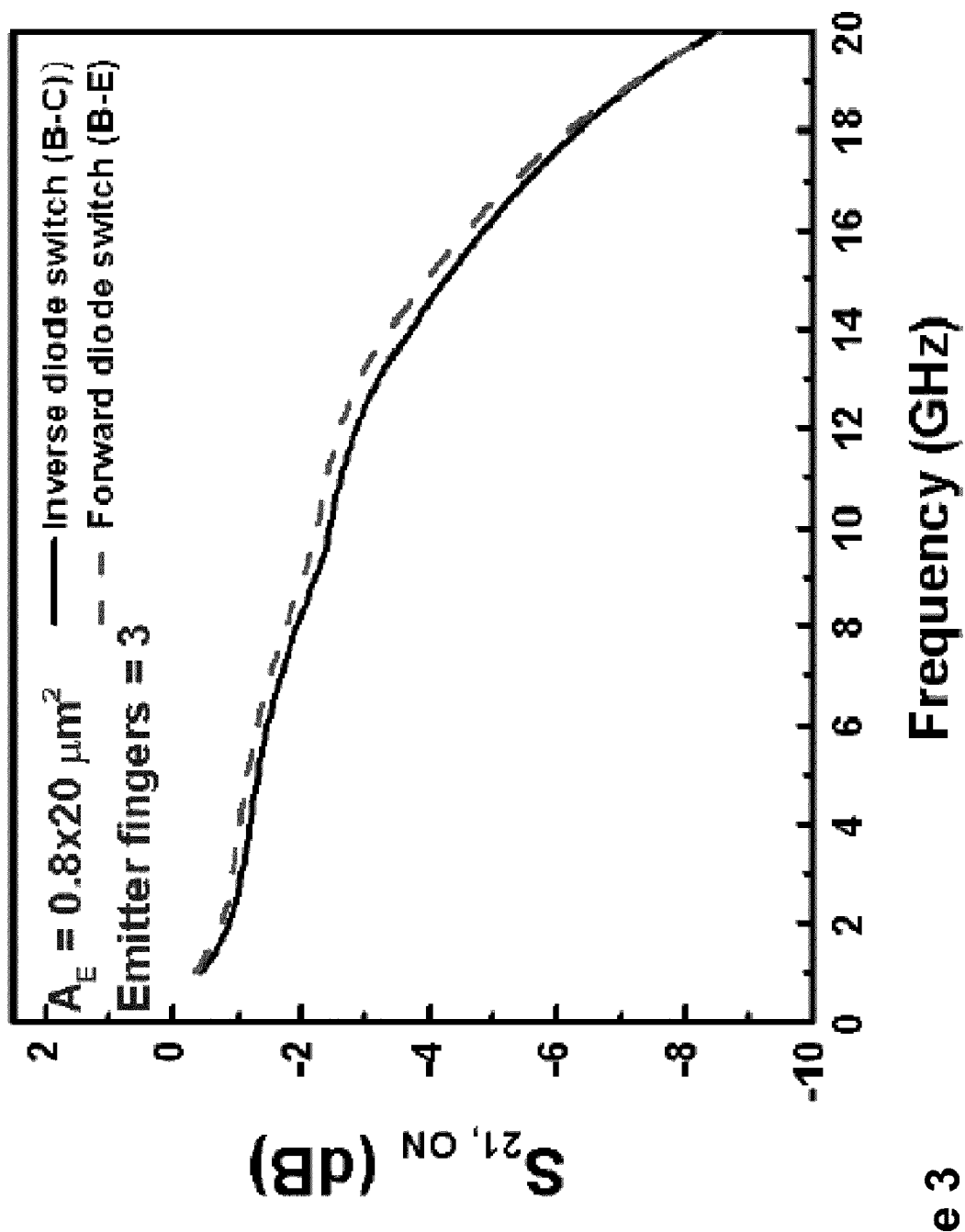
FIG. 3 provides a graphical comparison of the insertion loss between a conventional RF switch and an exemplary inverse-mode RF switching circuit of the present invention.

FIG. 3 provides a graphical comparison of the insertion loss between a conventional RF switch (Forward diode switch B-E), which uses the base-emitter junction as the switching diode, and an exemplary inverse-mode RF switching circuit 100 of the present invention (Inverse diode switch B-C). The insertion loss of the inverse-mode RF switching circuit 100 is slightly higher than the conventional switch. This is due to the high intrinsic collector resistance in the inverse-mode RF switching circuit 100 compared to the low emitter resistance in the conventional switch.

Figure 4:
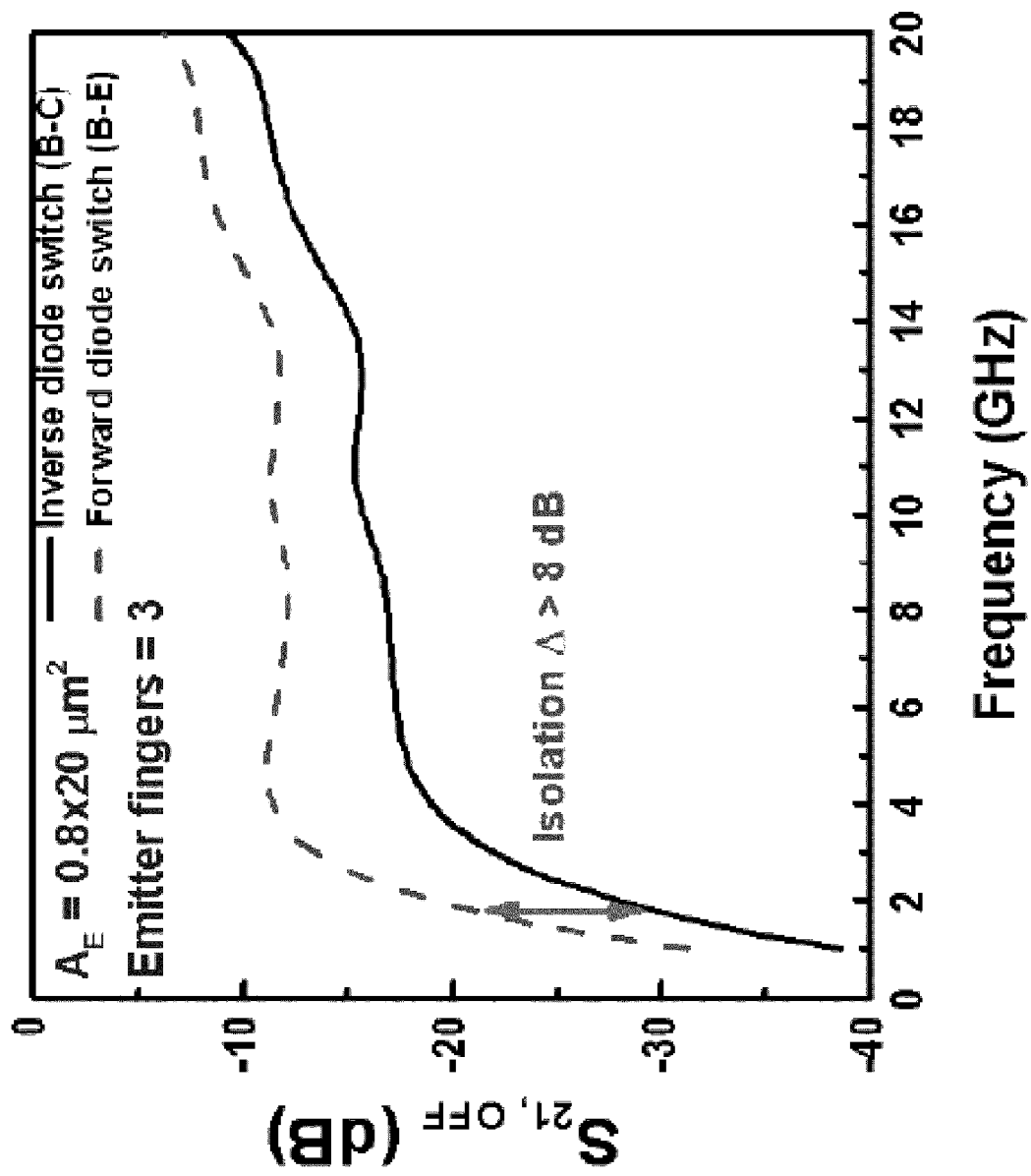
FIG. 4 provides a graphical comparison of the isolation degradation between a conventional RF switch and an exemplary inverse-mode RF switching circuit of the present invention.

FIG. 4 provides a graphical comparison of isolation between a conventional RF switch (Forward diode switch B-E), which uses the base-emitter junction as the switching diode, and an exemplary inverse-mode RF switching circuit 100 of the present invention (Inverse diode switch B-C). As illustrated in FIG. 4, the isolation of the inverse-mode RF switching circuit 100 of the present invention is improved considerably over the conventional RF switch. Further, this improvement is observed across the whole frequency spectrum, with about 8 dB improvement at 2 GHz and about 6 dB improvement around the center of the X-band (9.5 GHz). When the exemplary inverse-mode RF switching circuit 100 is turned OFF, negligible leakage current flows through the diode and the base-collector junction 125 is reverse-biased. The base-collector junction 125 also has a longer depletion region and, thus, smaller capacitance than the base-emitter junction 120. Therefore, this smaller capacitance can allow for better isolation in the exemplary inverse-mode RF switching circuit 100. Therefore, some embodiments of the present invention provide an improved RF switching circuit that achieves isolation performance that is at least 5 dB greater than the isolation performance of conventional switches in the frequency range of 2 GHz to 9.5 GHz.

Figure 5:
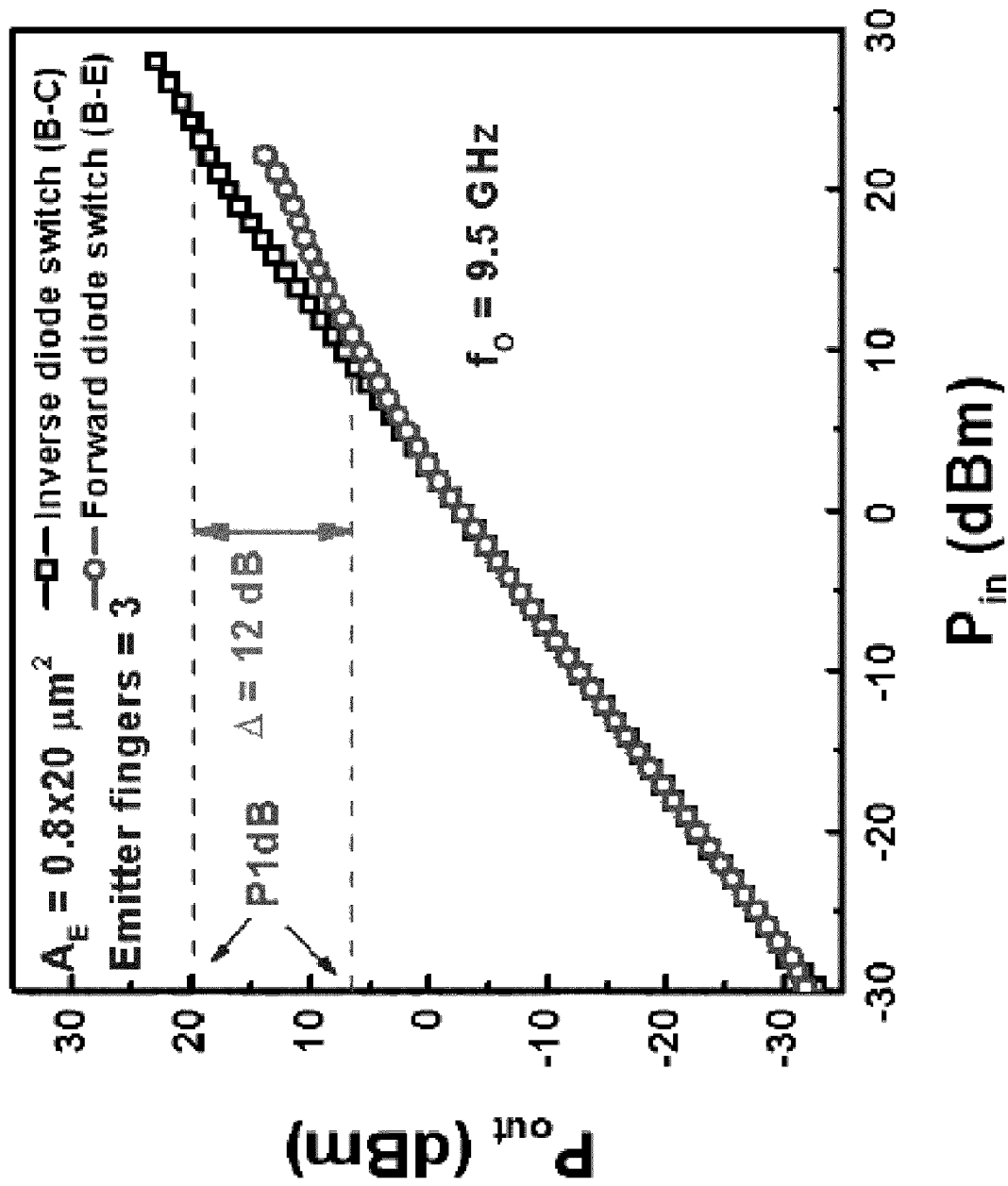
FIG. 5 provides a graphical comparison of the compression point performance between a conventional RF switch and an exemplary inverse-mode RF switching circuit of the present invention.

To evaluate the large-signal potential of a conventional RF switch (Forward diode switch B-E), which uses the base-emitter junction as the switching diode, and an exemplary inverse-mode RF switching circuit 100 of the present invention (Inverse diode switch B-C), 1 dB compression point measurements were performed at 9.5 GHz on both switches. As shown in FIG. 5, the exemplary inverse-mode RF switching circuit 100 gives a P1dB compression point of about 20 dBm, which is a 12 dB improvement over the conventional RF switch. The significant improvement in high-power handling capability of the inverse-mode RF switching circuit 100 is due to the longer depletion width of the base-collector junction 125, thus allowing for a larger swing before the switching circuit 100 goes into compression. Therefore, some embodiments of the present invention provide an improved RF switching circuit that achieves a P1 db compression point at 9.5 GHz that is at least 11 dB greater than the P1dB compression point of conventional RF switches at 9.5 GHz.

Figure 6:
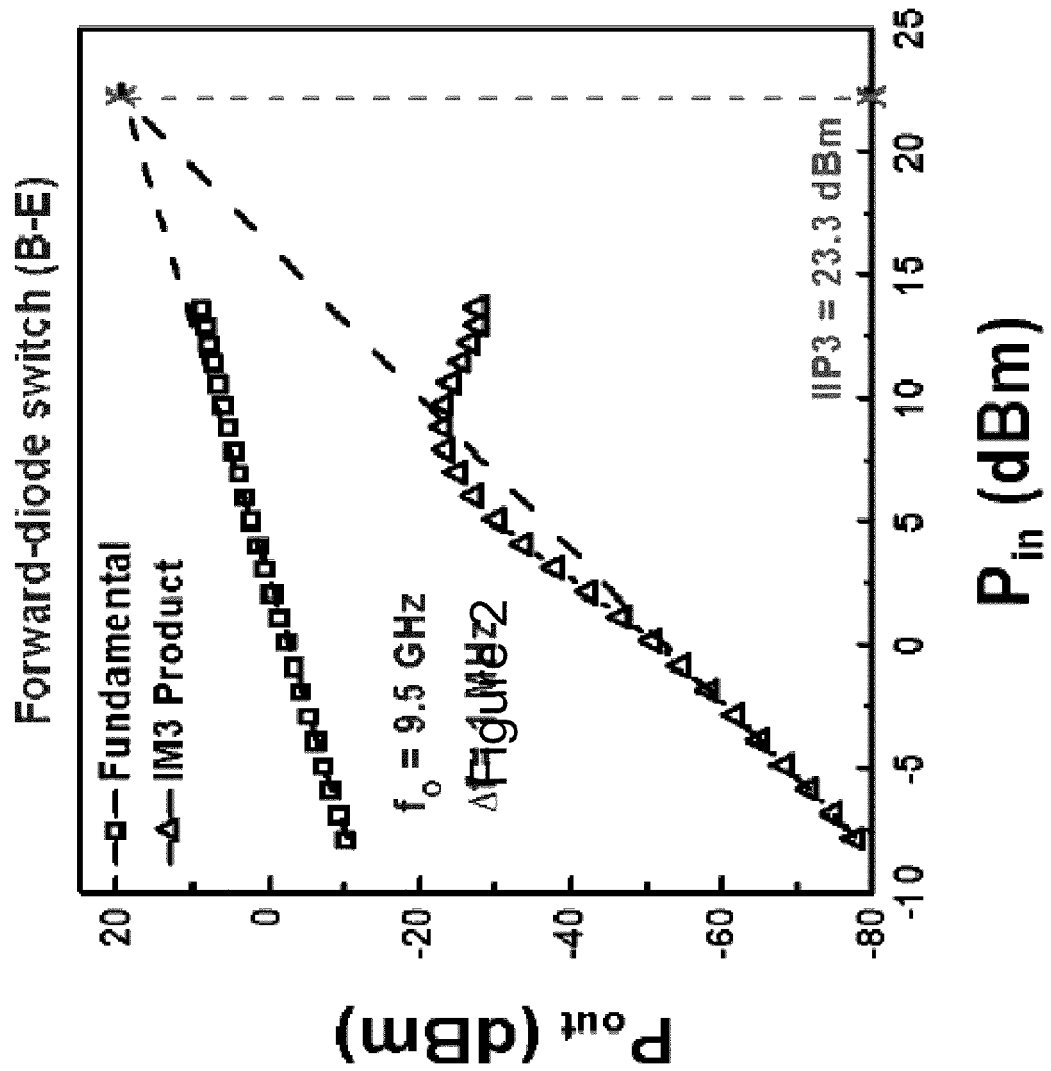
FIG. 6 illustrates the extrapolated IIP3, which is indicative of linearity performance, of a conventional RF switch.
Figure 7:
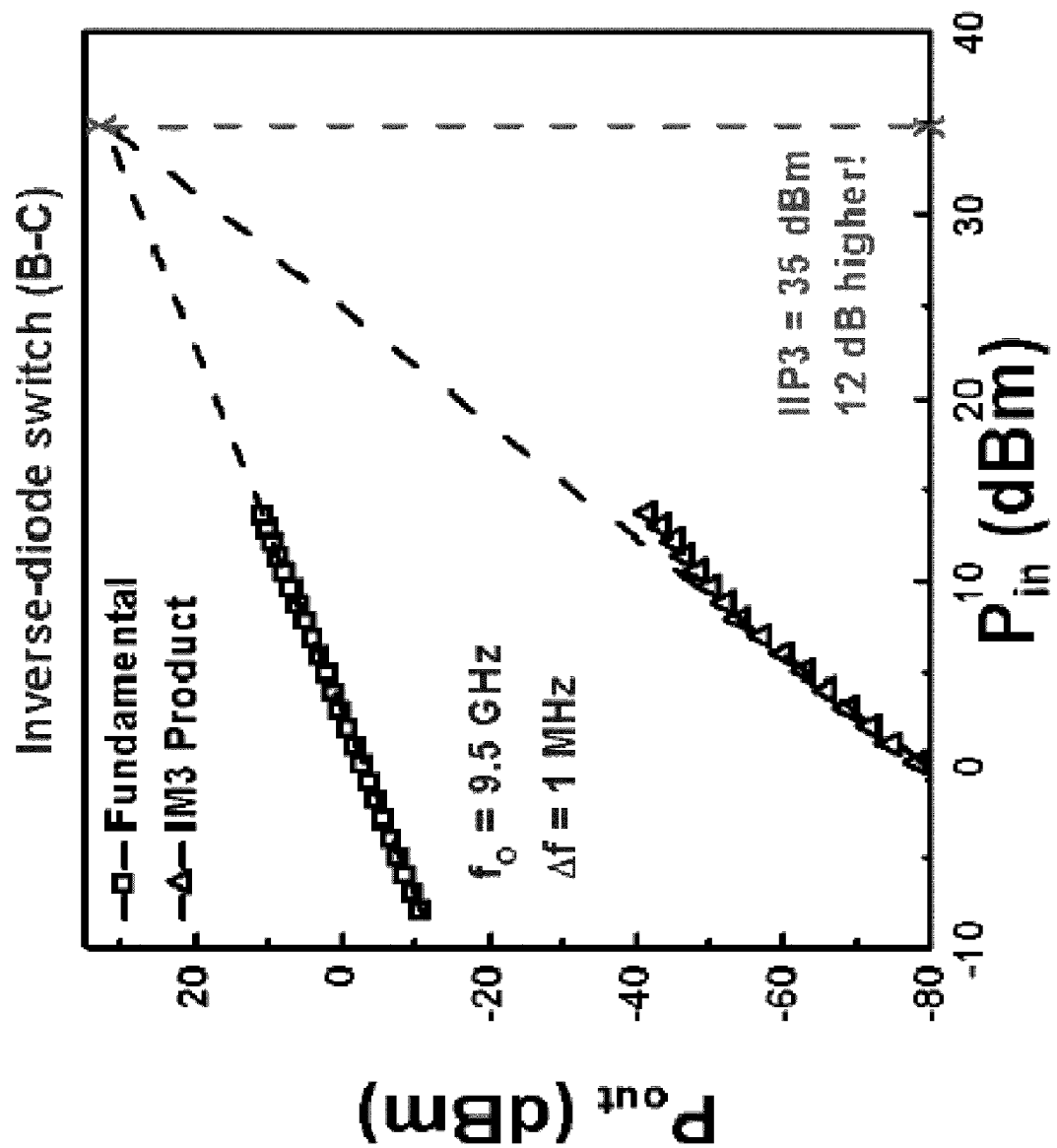
FIG. 7 illustrates the extrapolated IIP3, which is indicative of linearity performance, of an exemplary inverse-mode RF switching circuit of the present invention.

Two tone measurements were used to calculate the input third-order intercept ("IIP3") of a conventional RF switch (Forward diode switch B-E), which uses the base-emitter junction as the switching diode, and an exemplary inverse-mode RF switching circuit 100 of the present invention (Inverse diode switch B-C). The center frequency was kept at 9.5 GHz with a tone spacing of 1 MHz. FIG. 6 illustrates that the extrapolated IIP3 of the conventional RF switch was 23.3 dBm. FIG. 7 illustrates that the extrapolated IIP3 of the exemplary inverse-mode RF switching circuit 100 of the present invention was 35 dBm, which is 12 dB higher than the conventional switch, and thought to be record linearity performance in the X-band. Thus, the exemplary inverse-mode RF switching circuit 100 of the present invention provides superior linearity performance over conventional RF switches. Therefore, some embodiments of the present invention provide an improved RF switching circuit that achieves a linearity performance that is at least 10 dB greater than the linearity performance of convention RF switches in the X band (8.0 GHz-12.0 GHz) frequency range.

Performance of a conventional RF switch (Forward diode switch B-E), which uses the base-emitter junction as the switching diode, and an exemplary inverse-mode RF switching circuit 100 of the present invention (Inverse diode switch B-C) were also tested when the switches underwent stress. RF stress was applied at 9.5 GHz for 300 seconds when the switches were ON by using an RF source and an external amplifier with a gain of 37 dB. All losses were calibrated using a power sensor to de-embed the RF power applied to the switches. S-parameters were measured while sweeping frequency from 1 GHz to 20 GHz. The switches were stressed at input power levels between 24 dBm and 33 dBm in 3 dB steps. The results of these stress tests are provided in FIGS. 8-11.

Figure 8:
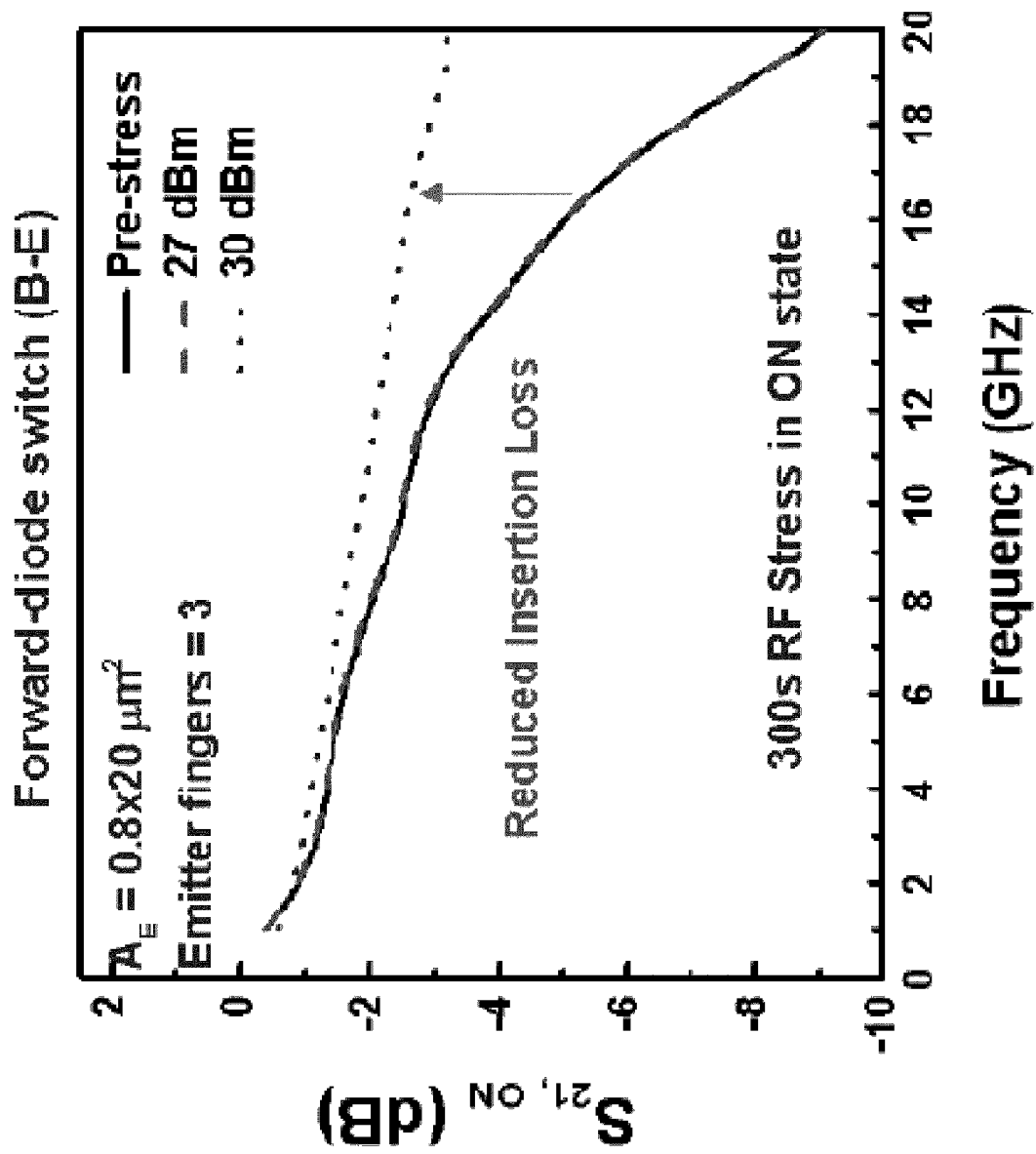
FIG. 8 illustrates the impact of RF stress on the insertion loss of a conventional RF switch.
Figure 9:
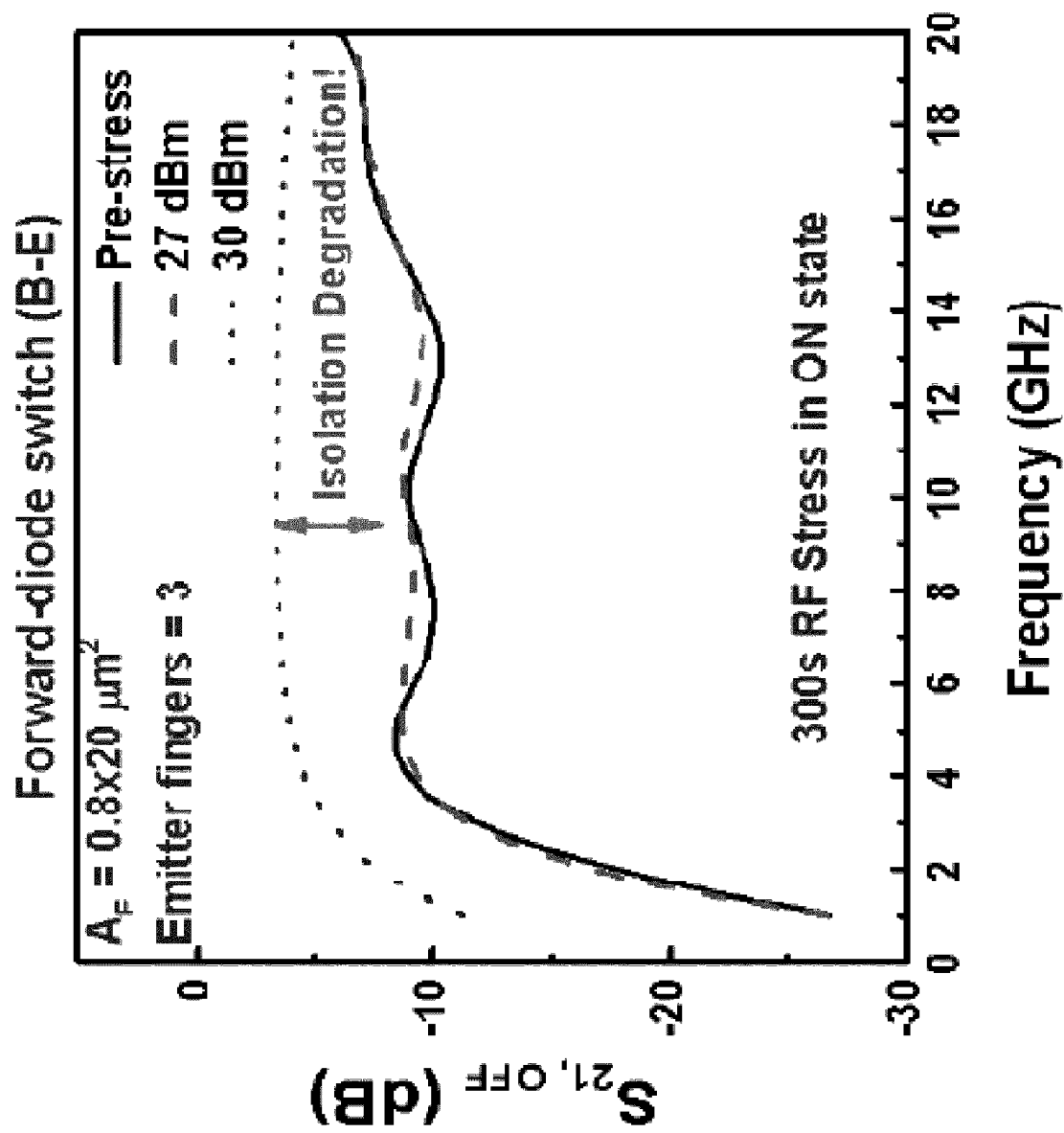
FIG. 9 illustrates the isolation degradation observed in a conventional RF switch.

FIG. 8 illustrates the impact of RF stress on the insertion loss of the conventional RF switch. There was no change in performance after the switch was stressed at 24 dBm and 27 dBm for 300 seconds. After stressing the conventional switch at 30 dBm RF power, the switch showed an improvement in insertion loss. FIG. 9 illustrates the isolation degradation observed in the conventional RF switch at 30 dBm, which leads to a near-failure condition (~5 dB isolation). The improvement in insertion loss and degradation in isolation in the conventional RF switches is due to the junction damage in the base-emitter junction. Due to the damaged base-emitter junction, the conventional RF switch stayed nearly ON even when the shunt element was pulled up.

Figure 10:
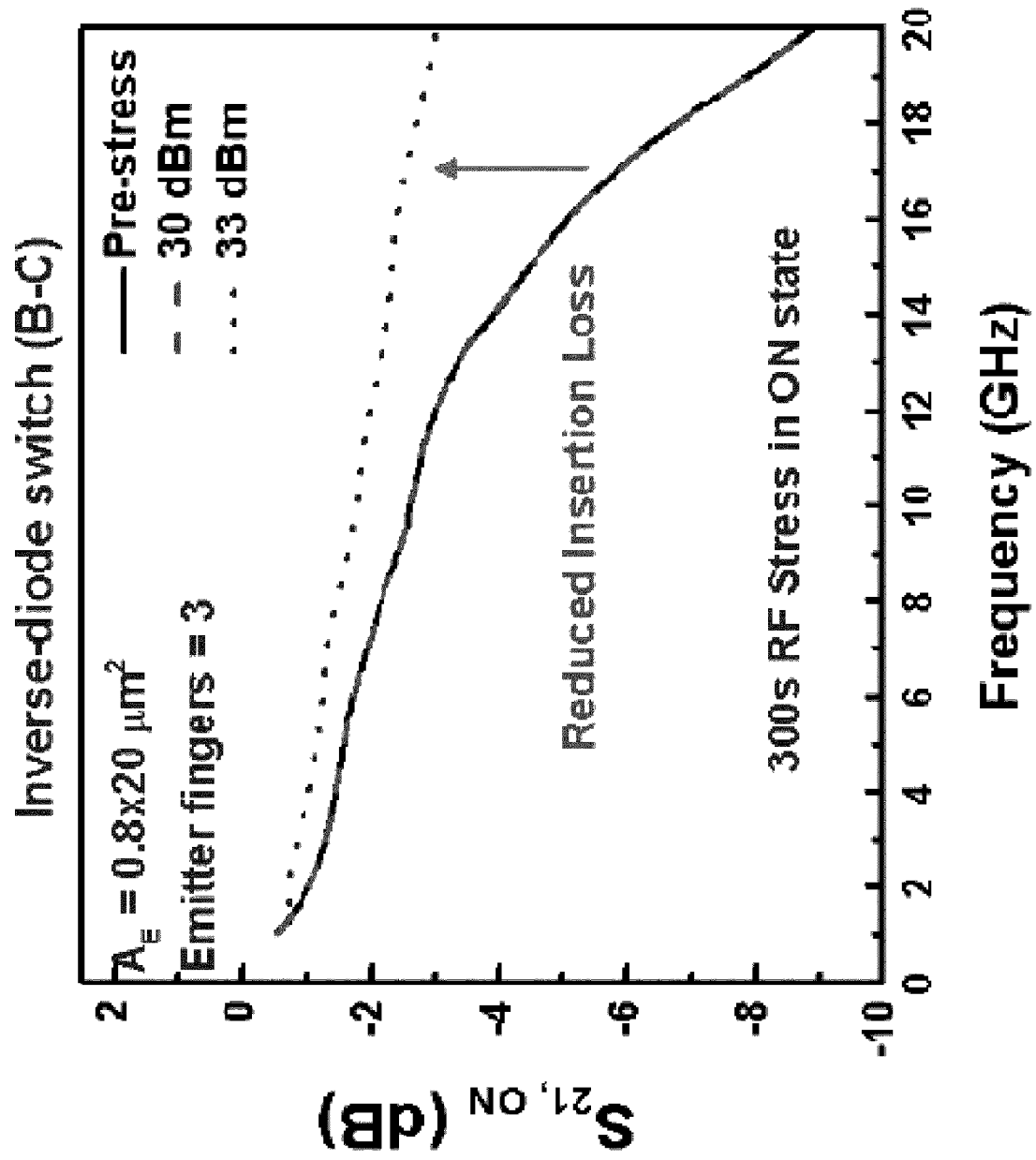
FIG. 10 illustrates the impact of RF stress on the insertion loss of an exemplary inverse-mode RF switching circuit of the present invention.
Figure 11:
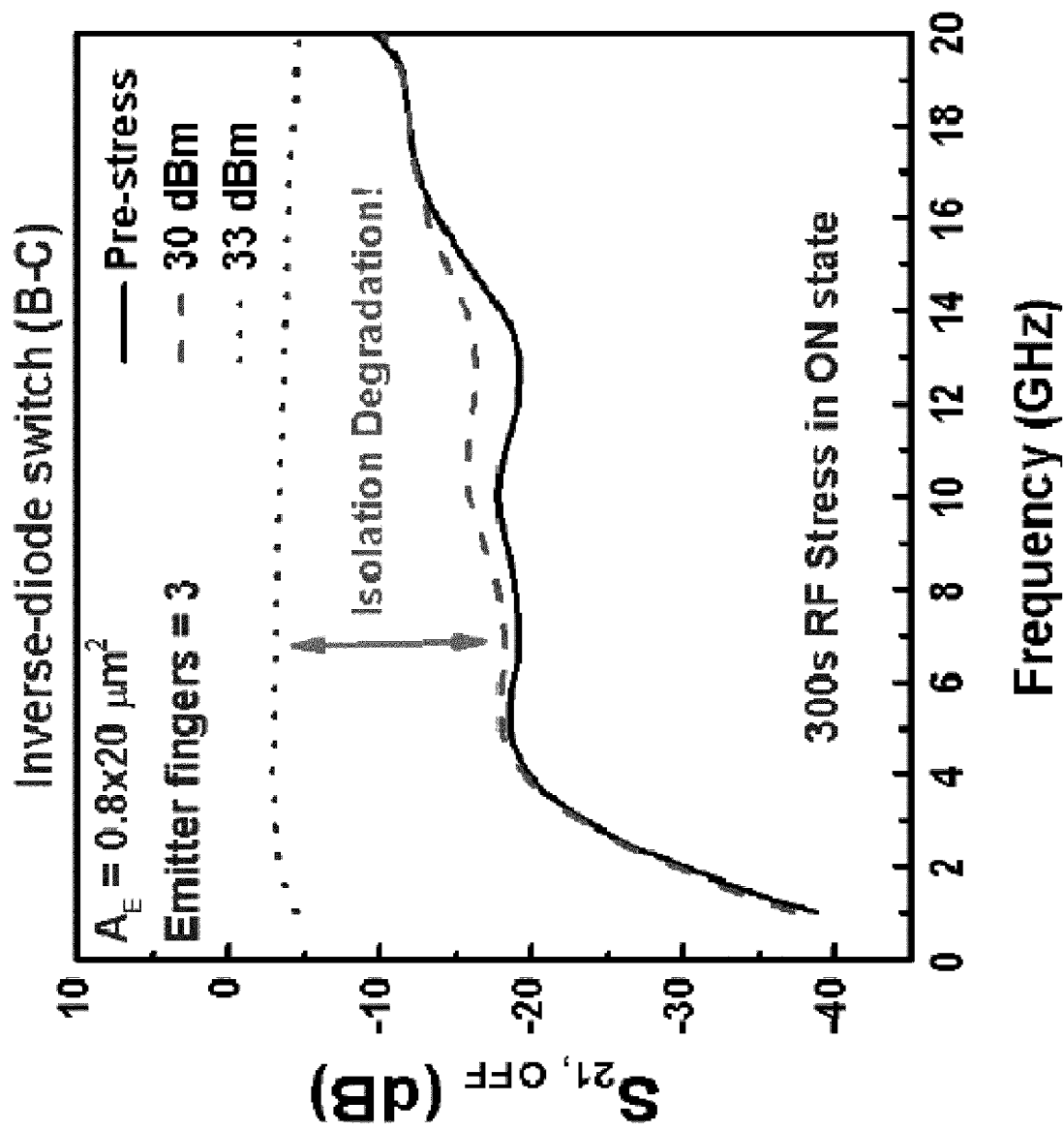
FIG. 11 illustrates the isolation degradation observed in an exemplary inverse-mode RF switching circuit of the present invention.

FIG. 10 illustrates the impact of RF stress on the insertion loss of the exemplary inverse-mode RF switching circuit 100 of the present invention. FIG. 11 illustrates the isolation degradation observed in the exemplary inverse-mode RF switching circuit 100 of the present invention. Similar degradation was observed in insertion loss and isolation for the conventional RF switch and the inverse-mode RF switching circuit 100. In the inverse-mode RF switching circuit, however, the damage was observed only after stressing the switch at 33 dBm for 300 seconds in the ON state. Thus, conventional RF switches begin degrading at 30 dBm RF input power while an exemplary inverse-mode RF switching circuit 100 of the present invention is capable of withstanding 30+dBm of RF power. The higher power handling capability of the exemplary inverse-mode RF switching circuit 100 is due to the higher value of $BV_{CBO}$ (open-emitter base-collector junction breakdown voltage) compared to $BV_{EBO}$ (open-collector base-emitter junction breakdown voltage) in the bipolar transistor. Therefore, some embodiments of the present invention provide an improved radio-frequency switching circuit that can withstand more than 30 dBm radio-frequency input power at a frequency of 9.5 GHz before insertion loss and/or isolation performance begin to degrade.

Figure 12:
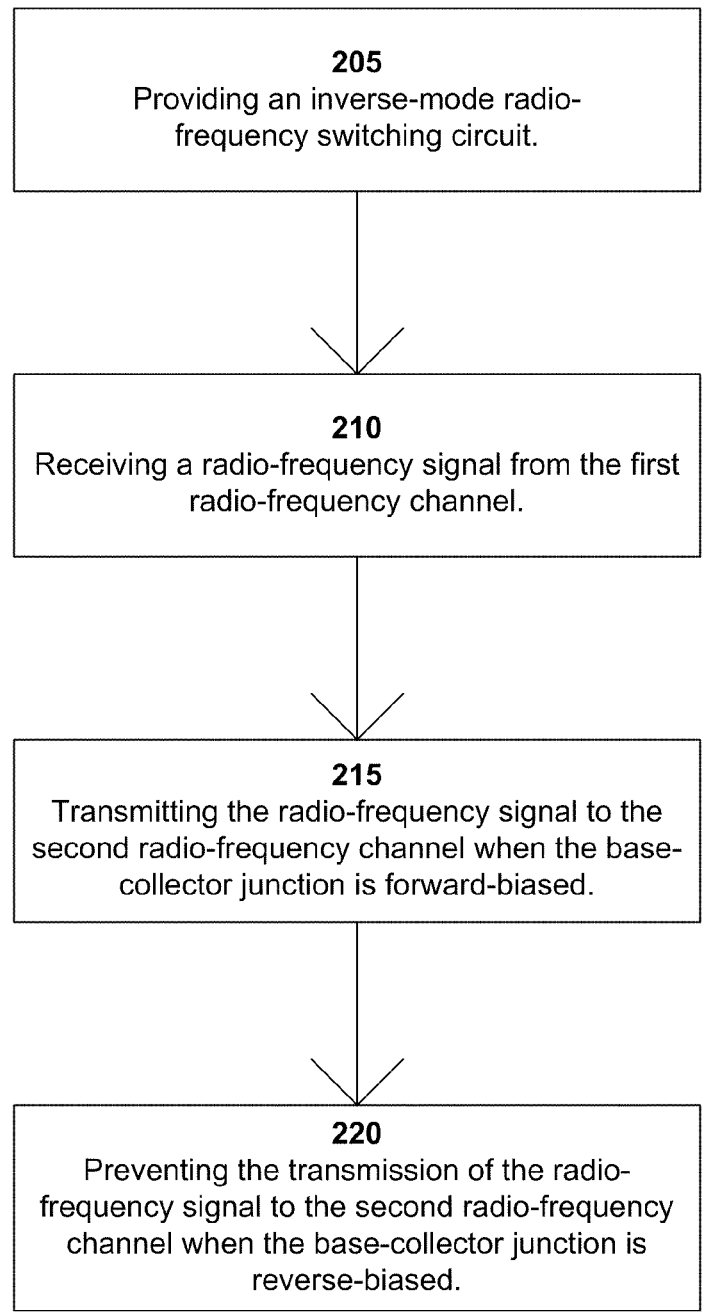
FIG. 12 provides a method of switching an RF signal in accordance with an exemplary embodiment of the present invention.

In addition to inverse mode RF switching circuits 100, the present invention provides methods of switching an RF signal. FIG. 12 provides a method of switching an RF signal 200 in accordance with an exemplary embodiment of the present invention. The method 200 comprises providing an inverse-mode RF switching circuit 205, receiving an RF signal from a first RF channel 210, and transmitting the RF signal to a second RF channel when the base-collector junction of a bipolar transistor in the switching circuit is forward-biased 215. The method of switching an RF signal 200 can further comprise preventing the transmission of the RF signal to the second RF channel when the base-collector junction of the bipolar transistor in the switching circuit is not forward-biased or is reverse-biased 220.

In some embodiments of the present invention, the inverse-mode RF switching circuit is a bidirectional switch. Thus, the method of switching an RF signal 200 can comprise providing an inverse-mode RF switching circuit 205, receiving an RF signal from a second RF channel, and transmitting the RF signal to a first RF channel when the base-collector junction of the bipolar transistor in the inverse-mode RF switching circuit is forward-biased. The method of switching an RF signal 200 can further comprise preventing the transmission of the RF signal to the first RF channel when the base-collector junction of the bipolar transistor in the switching circuit is not forward-biased or is reverse-biased.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. It is intended that the application is defined by the claims appended hereto.

What is claimed is:

1. An inverse-mode radio-frequency switching circuit, comprising:
   a bipolar transistor comprising a base, a collector, and an emitter, wherein the base and emitter are in electrical communication first via a base-emitter junction and second via an electrical connection element;
   a shunt element in electrical communication with the collector;
   a first radio-frequency channel in electrical communication with the base and emitter; and
   a second radio-frequency channel in electrical communication with the collector and shunt element;
   wherein a base-collector junction of the bipolar transistor operates as a switching diode between the first radio-frequency channel and the second radio-frequency channel.

2. The inverse-mode radio-frequency switching circuit of claim 1, wherein the shunt element comprises a p-channel MOSFET.

3. The inverse-mode radio-frequency switching circuit of claim 1, wherein the shunt element comprises a second bipolar transistor.

4. The inverse-mode radio-frequency switching circuit of claim 1, wherein the shunt element comprises a PIN diode.

5. The inverse-mode radio-frequency switching circuit of claim 1, wherein the shunt element comprises an n-channel MOSFET.

6. The inverse-mode radio-frequency switching circuit of claim 1, wherein the bipolar transistor is a SiGe heterojunction bipolar transistor.

7. The inverse-mode radio-frequency switching circuit of claim 1, wherein the base and emitter are in direct electrical communication via the electrical connection element.

8. In a radio-frequency switching circuit comprising a bipolar transistor, a first radio-frequency channel in electrical communication with the bipolar transistor, and a second radio-frequency channel in electrical communication with the bipolar transistor, the radio-frequency switching circuit achieving a first isolation performance in the frequency range of 2 GHz to 9.5 GHz, the radio-frequency switching circuit achieving a first P1dB compression point at 9.5 GHz, the radio-frequency switching circuit achieving a first linearity performance in the X band frequency range, the improvement comprising wherein the radio-frequency switching circuit achieves a second isolation performance at least 5 dB greater than the first isolation performance in the frequency range 2 GHz to 9.5 GHz.

9. The improved radio-frequency switching circuit of claim 8, the improvement further comprising wherein the radio-frequency switching circuit achieves a second P1dB compression point that is at least 11 dB greater than the first P1dB compression point at a frequency of 9.5 GHz.

10. The improved radio-frequency switching circuit of claim 8, the improvement further comprising wherein the radio-frequency switching circuit achieves a second linearity performance at least 10 dB greater than the first linearity performance in the X band frequency range.

11. The improved radio-frequency switching circuit of claim 8, the improvement further comprising wherein the radio-frequency switching circuit can withstand more than 30 dBm radio-frequency input power at a frequency of 9.5 GHz before isolation performance begins to degrade.

12. The improved radio-frequency switching circuit of claim 8, the improvement further comprising wherein the radio-frequency switching circuit can withstand more than 30 dBm radio-frequency input power at a frequency of 9.5 GHz before insertion loss performance begins to degrade.

13. A method of switching a radio-frequency signal, comprising:
providing an inverse-mode radio-frequency switching circuit, comprising:
a bipolar transistor comprising a base, a collector, an emitter, and a base-collector junction wherein the base and emitter are in electrical communication first via a base-emitter junction and second via an electrical connection element;
a shunt element in electrical communication with the collector;
a first radio-frequency channel in electrical communication with the base and emitter; and
a second radio-frequency channel in electrical communication with the collector and shunt element;
receiving a radio-frequency signal from the first radio-frequency channel; and
transmitting the radio-frequency signal to the second radio-frequency channel when the base-collector junction is forward-biased.

14. The method of switching a radio-frequency signal of claim 13, further comprising preventing the transmission of the radio-frequency signal to the second radio-frequency channel when the base-collector junction is reverse-biased.

15. The inverse-mode radio-frequency switching circuit of claim 13, wherein the shunt element comprises a p-channel MOSFET.

16. The inverse-mode radio frequency switching circuit of claim 13, wherein the shunt element comprises a second bipolar transistor.

17. The inverse-mode radio frequency switching circuit of claim 13, wherein the shunt element comprises a PIN diode.

18. The inverse-mode radio frequency switching circuit of claim 13, wherein the bipolar transistor is a SiGe heterojunction bipolar transistor.

* * * * *